United States Patent [19]

Aono

[11] Patent Number: 4,903,110
[45] Date of Patent: Feb. 20, 1990

[54] SINGLE PLATE CAPACITOR HAVING AN ELECTRODE STRUCTURE OF HIGH ADHESION

[75] Inventor: Yohichi Aono, Tokyo, Japan
[73] Assignee: NEC Corporation, Tokyo, Japan
[21] Appl. No.: 206,427
[22] Filed: Jun. 14, 1988
[51] Int. Cl.[4] ............................................. H01L 27/02
[52] U.S. Cl. ........................................ 357/51; 357/71; 357/54; 357/81
[58] Field of Search ................. 357/71, 51, 81, 54, 357/54 A, 54 M

[56] References Cited

U.S. PATENT DOCUMENTS

| 3,496,428 | 2/1970 | Volder | 357/71 |
| 3,499,213 | 3/1970 | Lands et al. | 357/71 X |
| 4,112,196 | 9/1978 | Selig et al. | 357/71 X |
| 4,700,457 | 10/1987 | Matsukawa | 357/51 X |

FOREIGN PATENT DOCUMENTS

| 52-63069 | 5/1977 | Japan | 357/71 X |
| 57-211269 | 12/1982 | Japan | 357/71 X |
| 8201102 | 4/1982 | World Int. Prop. O. | 357/71 X |

OTHER PUBLICATIONS

Hoffman et al., "Ohmic Noble Metal Contacts to Semiconductor Oxides," *IEEE Transactions on Components and Manufacturing Technology*, vol. CHMT—2, No. 1, Mar. 1979, pp. 81–83.

Ting et al., "The Use of Titanium—Based Contact Barrier Layers in Silicon Technology", *Thin Solid Films*, 96, (1982), 327–345.

Romankiw, "Depositing Adhesion Layers Between Moble Metals and Dielectric Material," *IBM Technical Disclosure Bulletin*, vol. 18, No. 5, Oct. 1975, 1635–38.

Primary Examiner—William Mintel
Attorney, Agent, or Firm—Helfgott & Karas

[57] ABSTRACT

A single plate capacitor includes a dielectric substrate having high dielectric constant, a first $SiO_2$ film formed on a lower main surface of the dielectric substrate, a first TiW film formed on the first $SiO_2$ film, a solder diffusion barrier film of Pt, Pd or Ni formed on the first TiW film, a first Au film formed on the solder diffusion barrier film, a second $SiO_2$ film formed on an upper main surface of the dielectric substrate, a second TiW formed on the second $SiO_2$ film and a second Au film formed on the second $SiO_2$ film.

6 Claims, 1 Drawing Sheet

SINGLE PLATE CAPACITOR HAVING AN ELECTRODE STRUCTURE OF HIGH ADHESION

BACKGROUND OF THE INVENTION

The present invention relates to a single plate capacitor, or a so-called chip capacitor, and more particularly, to the capacitor used in a semiconductor device for an impedance matching or other functions.

In a high power amplifier device for a microwave frequency signal, an impedance matching circuit is used for signal input and/or signal output. Such circuit is formed by a lumped constant network consisting of a lumped constant capacitor and a wire inductor. As the capacitor and the inductor, are used a single plate capacitor employing a substrate of high dielectric constant and a Au bonding wire having a diameter of 20 to 30 μm in order to fully exploit the performance of each circuit element.

The above-mentioned single plate capacitor is equipped with electrodes having Au films on uppermost and lowermost surfaces. The single plate capacitor is first mounted on a stem in a package by soldering the lowermost Au film with the use of an eutectic solder such as AuSn or AuSi, together with a semiconductor chip, and then the uppermost Au film is connected by the Au bonding wire to the semiconductor chip.

However, adhesion strength of the conventional single plate capacitor to the package stem has greatly depended on a processing period of the soldering step and was inversely lowered as the processing period became longer. Particularly, when a plurality of single plate capacitors were mounted into one package, the Au of the electrode was consumed by reacting with the solder in the subsequent mounting work of other single plate capacitors, so that the first-mounted single plate capacitor lost the Au from the electrode to be peeled off easily from the solder. Furthermore, when the area of the electrode of the capacitor became smaller than 1 mm$^2$, the adhesion strength was lowered a great deal. In particular, if tensile strength were applied to the capacitor through the Au bonding wire in the wire-bonding process, the electrode peeled off easily from the package stem.

SUMMARY OF THE INVENTION

It is, therefore, a primary object of the present invention to provide a single plate capacitor having an improved electrode structure which is rigidly soldered onto a package stem.

It is another object of the present invention to provide a single plate capacitor having an improved multilayer electrode in which adhesion between the layers is not lost in a soldering process.

The single plate capacitor in accordance with the present invention includes a dielectric substrate having an upper and lower main surfaces, a first SiO$_2$ film formed on the lower main surface of the dielectric substrate, a first TiW film formed on the first SiO$_2$ film, a barrier film provided against a solder diffusion formed on the first TiW film, a first Au film formed on the barrier film, a second SiO$_2$ film formed on the upper main surface of the dielectric substrate, a second TiW film formed on the second SiO$_2$ film and a second Au film formed on the second TiW film. The barrier film may be formed of a metal selected from a group consisting of Pt, Pd and Ni.

TiW has a large adhesion strength both to metals such as Au and the barrier metal and to dielectric materials such as TiO$_2$ which is preferably included in the dielectric substrate and can withstand a high temperature of 400° C. or above. Accordingly, the TiW film can prevent the electrode from peeling off at the wire bonding step. Etchability of TiW at the patterning step using a photoresist is higher than that of Ti and Cr. Therefore, the capacitance of the capacitor can be controlled accurately by controlling the area of TiW.

Pt, Pd and Ni act as a diffusion barrier to solder. Therefore, even if the soldering process becomes long, their adhesion strength to a package stem is not weakened. When Pt is used, higher adhesion strength can be obtained than Pd and Ni at a high temperature of from 300° C. to 400° C.

BRIEF DESCRIPTION OF THE DRAWING

The above and further objects, features and advantages of the present invention will become more apparent from the following detailed description taken in conjunction with the accompanying drawing, wherein.

DESCRIPTION OF THE PREFERRED EMBODIMENT

Figure 1:
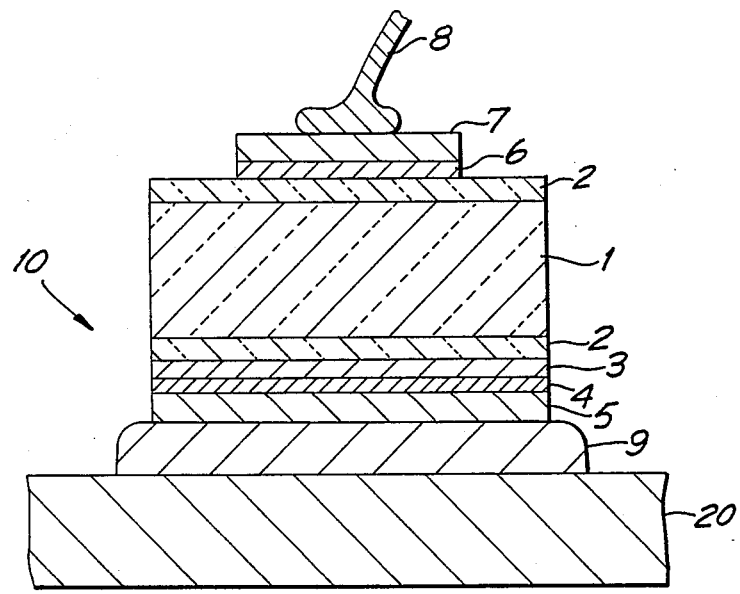
FIG. 1 is a sectional view of a single plate capacitor in accordance with an embodiment of the present invention when it is mounted on a heat-sink substrate.

Referring to FIG. 1, a dielectric substrate 1 having high dielectric constant ε of about 90 and made of titanium oxide (TiO$_2$) is first lapped and polished to a thickness of 150 μm. After the surface of the substrate 1 is cleaned by an organic solvent such as trichloroethylene, a SiO$_2$ film 2 having a thickness of 5000 Å is deposited on both surfaces of the substrate 1 by a Chemical Vapor Deposition (CVD) or a sputtering. Next, a TiW film (Ti: 10 wt %) 3 having a thickness of 600 Å, a Pt film 4 having a thickness of 2000 Å and a Au film 5 having a thickness of 3 μm are consecutively formed in this order by a sputtering method on the lower surface of the substrate 1. Next, the substrate 1 is turned upside down and a TiW film 6 having a thickness of 600 Å and a Au film 7 having a thickness of 3 μm are formed consecutively in this order in the same way as above. Next, in order to obtain a predetermined capacitance value, the electrode consisting of the TiW film 6 and Au film 7 is etched with an ordinary photo-lithography process and is then diced to obtain individual single plate capacitors. Then, the single plate capacitor 10 thus obtained is mounted on a heat-sink substrate 20 by a solder 9, and a Au wire 8 is bonded to the Au film 7.

For checking the effect of the inserted SiO$_2$ films 2 and the Pt film 4, one-hundred single plate capacitors made in accordance with the present embodiment were subjected to a die shear strength test and to a bond strength test. The tests were performed in accordance with the method 2017 and the method 2037 of U.S. Military Specification (MIL) MIL-STD-750C, respectively. As a result, it was found that all of the one-hundred capacitors satisfied the MIL standard. When one-hundred single plate capacitors without SiO$_2$ films 2 and the Pt film 4 were tested by the same method, on the other hand, thirty capacitors failed to satisfy the die shear strength test and ten capacitors failed to satisfy the bond strength test of the MIL standard.

Next, die shear strength of each of the single plate capacitors 10 according to the present invention and the single plate capacitor without using the Pt film 4 was measured. The die shear strength of the single plate capacitor of the present embodiment was 1.9 kg when mounted to the heat-sink substrate and 2.1 kg after keeping it at 330° C. for 20 minutes. Thus, the shear strength did not drop even at a high temperature. On the other hand, when the Pt film 4 was not used, the shear strength of the single plate capacitor scored a high value of 5.3 kg when mounted to the heat-sink substrate but dropped to 0.6 kg after an anneal at 330° C. for 20 minutes.

In the embodiment described above, the diffusion barrier layer to the solder was formed by the Pt film 4, but substantially the same result could be obtained when a Pd film or Ni film was used in place of the Pt film 4. When the Pt film was used, the die shear strength was as high as 2.1 kg even after an anneal at 330° C. for 20 minutes as described above, but when Pd or Ni was used, it was 1.8 kg when mounted, and 1.2 kg after an anneal at 330° C. for 20 minutes.

It is also possible to obtain an electrode structure having the adhesion as high as in the present embodiment when the dielectric substrate 1 is made of a dielectric material consisting essentially of $TiO_2$ and including other materials or a dielectric material belonging to $BaTiO_3$ system besides $TiO_2$.

The film thickness of the $SiO_2$ film 2 is preferably from 200 Å to 10,000 Å. When it is below 200 Å, pinholes will occur and adhesion will not be effectively improved. When the thickness is more than 10,000 Å, stress becomes greater due to the difference between thermal expansion coefficients, and peeling is more likely to occur. The film thickness of the TiW film 3, 6 is preferably from 200 Å to 1,000 Å. When it is below 200 Å, pin-holes will occur and when it is more than 1,000 Å, stress acting on the electrode would be greater. The film thickness of the Pt film 4 is preferably from 500 Å to 2,000 Å. When it is below 500 Å, it does not function as the solder diffusion barrier and when it is more than 2,000 Å, the single plate capacitor will become too expensive.

Although the invention has thus been described with reference to one preferred embodiment thereof, the invention is not particularly limited thereto but various changes and modifications could be made by those skilled in the art without departing from the scope and spirit thereof.

What is claimed is:

1. A single plate capacitor comprising:
   a dielectric substrate essentially consisting of $TiO_2$, and having a first and second main surfaces each provided with a multi-layer film structure positioned thereon,
   the multi-layer film structure on said first main surface of said dielectric substrate including:
   a first $SiO_2$ film formed on said first main surface,
   a first TiW film formed on said first $SiO_2$ film,
   a Pt film formed on said first TiW film, and
   a first Au film formed on said Pt film;
   the multi-layer film structure on said second main surface of said dielectric substrate including:
   a second $SiO_2$ film formed on said second main surface,
   a second TiW film formed on said second $SiO_2$ film, and
   a second Au film formed on said second TiW film.

2. A single plate capacitor as claimed in claim 1, wherein the thickness of said first and second $SiO_2$ films are from 200 Å to 10,100 Å, respectively, the thicknesses of said first and second TiW films are from 200 Å to 1,000 Å, respectively, and the thickness of said Pt film is from 500 Å to 2,000 Å.

3. A single plate capacitor as claimed in claim 1, wherein said second TiW film and said second Au film are patterned in predetermined sizes in order to obtain a predetermined capacitance value.

4. An electronic device comprising a heat-sink substrate and a single plate capacitor mounted on said heat-sink substrate by a Au eutectic solder, said single plate capacitor including:
   a dielectric substrate essentially consisting of $TiO_2$ and having an upper and lower main surface each provided with a multi-layer film structure positioned thereon;
   the multi-layer structure on said lower main surface of said dielectric substrate including:
   a first $SiO_2$ film formed on said lower main surface,
   a first TiW film formed on said first $SiO_2$ film,
   a Pt film formed on said first TiW film, and
   a first Au film formed on said Pt film;
   the multi-layer film on said upper main surface of said dielectric substrate including:
   a second $SiO_2$ film formed on said upper main surface,
   a second TiW film formed on said second $SiO_2$ film, and
   a second Au film formed on said second TiW film, wherein a metal wire is bonded on said second Au film.

5. An electric device as claimed in claim 4, wherein the thickness of said first and second $SiO_2$ films are from 200 Å to 10,000 Å, respectively, the thicknesses of said first and second TiW films are from 200 Å to 1,000 Å, respectively, and the thickness of said Pt film is from 500 Å to 2,000 Å.

6. An electronic device as claimed in claim 4, wherein said second TiW film and said Au second Au films are patterned in predetermined sizes in order to obtain a predetermined capacitance value.

* * * * *

UNITED STATES PATENT AND TRADEMARK OFFICE
CERTIFICATE OF CORRECTION

PATENT NO. : 4,903,110

DATED : February 20, 1990

INVENTOR(S) : Yohichi Aono

It is certified that error appears in the above-identified patent and that said Letters Patent is hereby corrected as shown below:

Title page, below the line " [22] Filed: June 14, 1988" insert

-- [30] Foreign Application Priority Data
June 15, 1987 [JP] Japan .... 62-149351--.

Signed and Sealed this

Seventeenth Day of March, 1992

Attest:

HARRY F. MANBECK, JR.

*Attesting Officer*          *Commissioner of Patents and Trademarks*